United States Patent
Nam et al.

(10) Patent No.: US 9,121,761 B2
(45) Date of Patent: Sep. 1, 2015

(54) INFRARED DETECTORS

(71) Applicant: Samsung Electronics Co., Ltd., Suwon-Si, Gyeonggi-Do (KR)

(72) Inventors: Sung-hyun Nam, Yongin-si (KR); Hae-seok Park, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 73 days.

(21) Appl. No.: 13/670,892

(22) Filed: Nov. 7, 2012

(65) Prior Publication Data

US 2013/0112876 A1     May 9, 2013

(30) Foreign Application Priority Data

Nov. 8, 2011 (KR) .......................... 10-2011-0115922

(51) Int. Cl.
| | |
|---|---|
| *G01J 5/20* | (2006.01) |
| *G01J 5/12* | (2006.01) |
| *G01J 5/04* | (2006.01) |
| *G01J 5/02* | (2006.01) |
| *G01J 5/06* | (2006.01) |
| *G01J 5/08* | (2006.01) |

(52) U.S. Cl.
CPC .. *G01J 5/12* (2013.01); *G01J 5/024* (2013.01); *G01J 5/0285* (2013.01); *G01J 5/045* (2013.01); *G01J 5/046* (2013.01); *G01J 5/06* (2013.01); *G01J 5/0853* (2013.01); *B81B 2201/0207* (2013.01)

(58) Field of Classification Search
CPC ................ G01J 5/10; G01J 5/20; G01J 5/024
USPC .............................. 250/338.1, 338.4, 370.08
See application file for complete search history.

(56) References Cited

U.S. PATENT DOCUMENTS

| | | | | |
|---|---|---|---|---|
| 6,339,220 | B1* | 1/2002 | Oda .......................... | 250/338.1 |
| 6,489,614 | B1* | 12/2002 | Deguchi et al. ............ | 250/338.1 |
| 7,869,045 | B1 | 1/2011 | Utsunomiya | |

(Continued)

FOREIGN PATENT DOCUMENTS

| | | |
|---|---|---|
| JP | 2009019893 A | 1/2009 |
| KR | 20110039170 A | 4/2011 |
| KR | 20110042848 A | 4/2011 |

OTHER PUBLICATIONS

"A Perfect Metamaterial Absorber" dated Mar. 5, 2008, by N.I. Landy et al., The American Physical Society.

*Primary Examiner* — David Porta
*Assistant Examiner* — Jeremy S Valentiner
(74) *Attorney, Agent, or Firm* — Harness, Dickey & Pierce, PLC

(57) ABSTRACT

In some example embodiments, an infrared detector may comprise a substrate; a resonator spaced apart from the substrate, the resonator absorbing incident infrared light; a thermoelectric material layer contacting the resonator and having a variable resistance according to temperature variation due to the absorbed incident infrared light; a lead wire electrically connecting the thermoelectric material layer and the substrate; a heat separation layer between the substrate and the thermoelectric material layer, the heat separation layer preventing heat from being transferred from the thermoelectric material layer to the substrate; and/or a ground plane layer preventing the incident infrared light from proceeding toward the substrate. The heat separation layer may at least reduce heat transfer from the thermoelectric material layer to the substrate. The ground plane layer may at least reduce an amount of the incident infrared light that reaches the substrate.

18 Claims, 7 Drawing Sheets

(56) References Cited

U.S. PATENT DOCUMENTS

| | | |
|---|---|---|
| 2003/0020017 A1 | 1/2003 | Cole |
| 2008/0136563 A1* | 6/2008 | Duwel et al. .................. 333/186 |
| 2009/0001271 A1* | 1/2009 | Erdtmann et al. ............ 250/347 |
| 2010/0096709 A1* | 4/2010 | Roukes ......................... 257/414 |
| 2010/0128275 A1 | 5/2010 | Chau et al. |
| 2012/0154793 A1* | 6/2012 | Pryce et al. ..................... 356/51 |

* cited by examiner

Ti RESONATOR : Ti GROUND PLANE LAYER

Ti RESONATOR : Au GROUND PLANE LAYER

INFRARED DETECTORS

CROSS-REFERENCE TO RELATED APPLICATION(S)

This application claims priority from Korean Patent Application No. 10-2011-0115922, filed on Nov. 8, 2011, in the Korean Intellectual Property Office (KIPO), the entire contents of which are incorporated herein by reference.

BACKGROUND

1. Field

Some example embodiments may relate to infrared detectors. Some example embodiments may relate to infrared detectors for receiving and/or sensing infrared light irradiated from objects.

2. Description of the Related Art

An absorber for absorbing light of an infrared (or terahertz) wavelength band and transforming the absorbed light into heat is an essential element of a bolometer-type detector for reading generated heat by a variation in an electrical resistance. An absorber used in an existing bolometer is of a Salisbury screen type having a structure in which a ground plane and a thin film absorber are stacked at a distance of $\lambda/4$. In this structure, since the amount of light to be absorbed is directly proportional to a certain area, a filling factor of the absorber in a pixel has to be maximized.

In this case, due to the absorption of light, heat is evenly generated by the thin film absorber. However, since the amount of light to be absorbed is reduced if a pixel size is reduced, the above structure is limited to reductions of the pixel size to be equal to or less than a certain value or improvement of a signal-to-noise ratio.

SUMMARY

Some example embodiments may provide infrared detectors in which heat generated by infrared absorbers using plasmon/metamaterial resonance efficiently increases the temperature of the absorbers.

In some example embodiments, an infrared detector may comprise a substrate; a resonator spaced apart from the substrate, the resonator absorbing incident infrared light; a thermoelectric material layer contacting the resonator and having a variable resistance according to temperature variation due to the absorbed incident infrared light; a lead wire electrically connecting the thermoelectric material layer and the substrate; a heat separation layer between the substrate and the thermoelectric material layer, the heat separation layer preventing heat from being transferred from the thermoelectric material layer to the substrate; and/or a ground plane layer preventing the incident infrared light from proceeding toward the substrate.

In some example embodiments, the heat separation layer may be between the ground plane layer and the thermoelectric material layer.

In some example embodiments, the ground plane layer may include metal. The ground plane may be formed on the substrate.

In some example embodiments, the resonator may include metal for generating a larger amount of heat than the ground plane layer in an infrared wavelength region.

In some example embodiments, the resonator may include one or more of titanium (Ti), nickel (Ni), chromium (Cr), copper (Cu), and platinum (Pt). The ground plane layer may include one or more of gold (Au), silver (Ag), and aluminum (Al).

In some example embodiments, the heat separation layer may be between the substrate and the ground plane layer.

In some example embodiments, the ground plane layer may include metal. The ground plane layer may contact the thermoelectric material layer.

In some example embodiments, the resonator may include metal generating a larger amount of heat than the ground plane layer or generating the same amount of heat as the ground plane layer in an infrared wavelength region.

In some example embodiments, the resonator may be a plasmon absorber, absorbing infrared light by using localized surface plasmon resonance (LSPR), or a metamaterial absorber, absorbing infrared light by using resonance of a metamaterial.

In some example embodiments, the heat separation layer may be a vacuum layer or a low thermal conductive layer.

In some example embodiments, the thermoelectric material layer may include vanadium oxide (VOx), amorphous silicon (a-Si), or vanadium oxide (VOx) and amorphous silicon (a-Si).

In some example embodiments, the thermoelectric material layer may support the resonator.

In some example embodiments, the thermoelectric material layer may have a same shape as the resonator. The thermoelectric material layer may have an area greater than or equal to that of the resonator.

In some example embodiments, the thermoelectric material layer may absorb the incident infrared light.

In some example embodiments, the heat separation layer may be a vacuum layer or a low thermal conductive layer.

In some example embodiments, the thermoelectric material layer may include vanadium oxide (VOx), amorphous silicon (a-Si), or vanadium oxide (VOx) and amorphous silicon (a-Si).

In some example embodiments, the thermoelectric material layer may support the resonator.

In some example embodiments, the thermoelectric material layer may have a same shape as the resonator. The thermoelectric material layer may have an area greater than or equal to that of the resonator.

In some example embodiments, the thermoelectric material layer may absorb the incident infrared light.

In some example embodiments, an infrared detector may comprise a substrate; a ground plane layer on the substrate; a heat separation layer on the ground plane layer; a thermoelectric material layer on the heat separation layer; and/or a resonator on the thermoelectric material layer. The resonator may be configured to absorb incident infrared light. The thermoelectric material layer may have a variable resistance according to temperature variation due to the absorbed incident infrared light. The heat separation layer may at least reduce heat transfer from the thermoelectric material layer to the substrate. The around plane layer may at least reduce an amount of the incident infrared light that reaches the substrate.

In some example embodiments, the infrared detector may further comprise a lead wire electrically connecting the thermoelectric material layer and the substrate.

In some example embodiments, an infrared detector may comprise a substrate; a heat separation layer on the substrate; a ground plane layer on the heat separation layer; a thermoelectric material layer on the ground plane layer; and/or a resonator on the thermoelectric material layer. The resonator may be configured to absorb incident infrared light. The thermoelectric material layer may have a variable resistance according to temperature variation due to the absorbed incident infrared light. The heat separation layer may at least reduce heat transfer from the thermoelectric material layer to the substrate. The ground plane layer may at least reduce an amount of the incident infrared light that reaches the substrate.

In some example embodiments, the infrared detector may further comprise a lead wire electrically connecting the thermoelectric material layer and the substrate.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
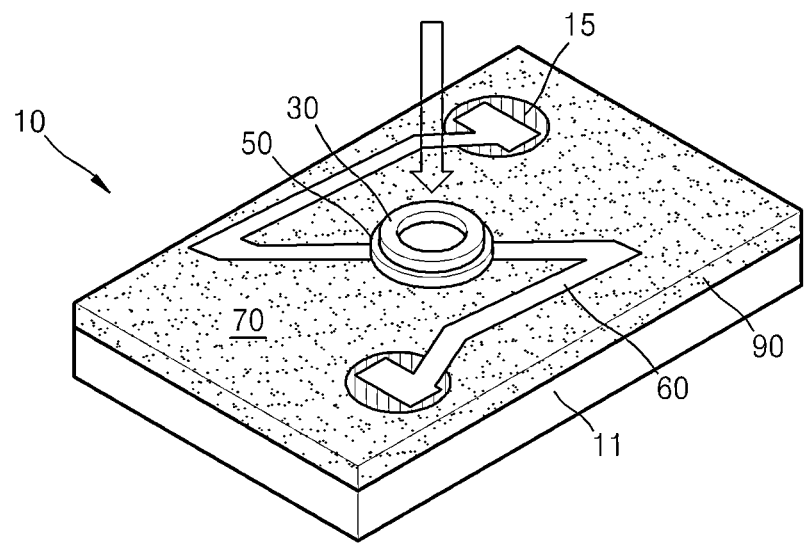
FIG. 1 is a perspective view of an infrared detector according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

When a plasmon or metamaterial resonance structure is used as an infrared absorber, due to resonance at a certain frequency, a cross-sectional area of optical absorption increases more than the cross-sectional area of geometric absorption. Accordingly, even when a resonance structure having a size much smaller than a pixel size is used, absorption of light at a resonance frequency may be greatly increased.

However, when an infrared absorber using plasmon or a metamaterial is formed by using three layers such as a ground plane layer, a dielectric layer, and a metal resonator layer, heat is generated by all three layers due to absorption of light. In this case, the generated heat (thermal energy) is transferred to a substrate via the dielectric layer and the ground plane layer. Accordingly, if the above structure is directly applied to, for example, an infrared detector, since heat is easily transferred to a substrate, the temperature of an absorber itself may not be greatly increased. As such, if a detection method for reading a temperature variation as a resistance variation is used as in a bolometer, infrared light may not be effectively and easily detected due to a small signal size.

An infrared detector according to some example embodiments includes a heat separation layer in an absorber using a plasmon/metamaterial resonator, and thus allows heat generated due to absorption of infrared light to effectively increase the temperature of the absorber.

Figure 2:
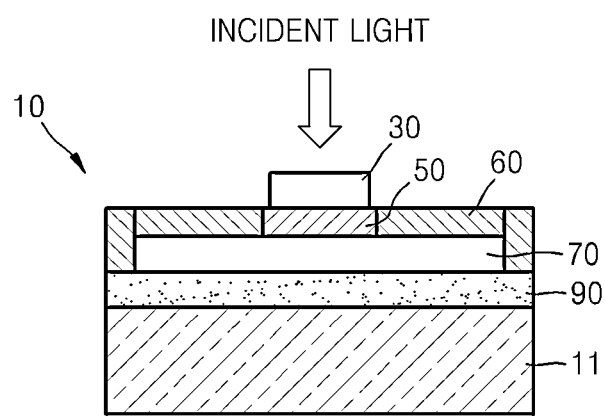
FIG. 2 is a cross-sectional view of FIG. 1.

FIG. 1 is a perspective view of an infrared detector 10 according to some example embodiments. FIG. 2 is a cross-sectional view of FIG. 1.

Referring to FIGS. 1 and 2, the infrared detector 10 includes a substrate 11, a resonator 30 spaced apart from the substrate 11, a thermoelectric material layer 50 contacting the resonator 30, a lead wire 60 for electrically connecting the thermoelectric material layer 50 and the substrate 11, a heat separation layer 70 for preventing heat from being transferred to the substrate 11 or reducing the amount of heat being transferred to the substrate 11, and a ground plane layer 90 for preventing incident light, i.e., infrared light, from proceeding toward the substrate 11 or reducing the amount of incident light proceeding toward the substrate 11.

Figure 3:
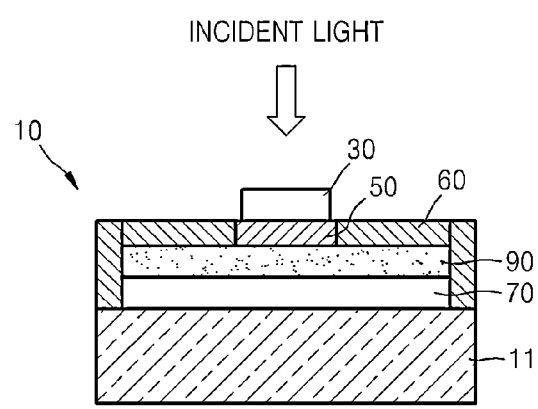
FIG. 3 is a cross-sectional view of an infrared detector according to some example embodiments.

The elements of an absorber may be formed on the substrate 11 and a read-out integrated circuit (IC) (not shown) for reading a temperature variation from each pixel may be further formed on the substrate 11. Also, a metal wiring 15 for electrically connecting the lead wire 60 and the read-out IC of the substrate 11 may be formed on the substrate 11. In the infrared detector 10, the absorber formed on the substrate 11 may have a cross-sectional structure as illustrated in FIG. 2 or 3. Hereinafter, the structure illustrated in FIG. 2 will be representatively described.

The resonator 30 may absorb infrared light. The resonator 30 may be formed of a material including metal. For example, the resonator 30 may be formed of a metallic material including at least one selected from the group consisting of gold (Au), titanium (Ti), aluminum (Al), copper (Cu), platinum (Pt), silver (Ag), nickel (Ni), chromium (Cr), and alloys thereof. The resonator 30 may have various geometric shapes for absorbing incident light, i.e., infrared light, by using resonance with the infrared light. For example, the resonator 30 may be a plasmon absorber for absorbing infrared light by using localized surface plasmon resonance (LSPR), or a metamaterial absorber for absorbing infrared light by using resonance of a metamaterial. When a metal structure has a limited size, a resonance wavelength exists in correspondence with its size and geometric shape, and polarization of incident light, and LSPR occurs. When the resonator 30 is formed as a plasmon absorber as a structure for generating surface plasmon resonance, a small metal structure may absorb light of a wide region. When incident light and a metal structure interact via the LSPR phenomenon, light may be concentrated on a very narrow region.

The thermoelectric material layer 50 may mechanically support the resonator 30, contact the resonator 30 to directly transfer heat generated when the resonator 30 absorbs infrared light, and have a variable resistance according to a temperature variation due to the absorbed infrared light. Also, a thermoelectric material layer 50 may function as a dielectric layer with respect to light. That is, the thermoelectric material layer 50 may include a material for changing a temperature variation due to absorbed infrared light into a resistance variation. Also, the thermoelectric material layer 50 may absorb a part of incident infrared light. For example, the thermoelectric material layer 50 may be formed of a thermoelectric material having a high temperature coefficient of resistance (TCR), e.g., amorphous silicon (a-Si), vanadium oxide (VOx), or nickel oxide, or a compound of the thermoelectric material and another dielectric.

As illustrated in FIG. 1, the thermoelectric material layer 50 may have a shape the same as that of the resonator 30, instead of a plane shape, and may have an area equal to or slightly greater than that of the resonator 30. FIG. 1 shows an example when the resonator 30 is formed in a ring shape and the thermoelectric material layer 50 is formed in a ring shape slightly greater than the resonator 30. Here, the reason why the thermoelectric material layer 50 is formed in a shape the same as that of the resonator 30, instead of a plane shape, is to minimize a thermal mass of the absorber and thus to improve a temperature increase due to absorption of light.

Meanwhile, the thermoelectric material layer 50 is connected to the lead wire 60. As such, a current flows through the thermoelectric material layer 50 and the lead wire 60, and thus, a resistance variation due to absorbed heat may be detected.

As a thermal leg, the lead wire 60 may be electrically connected between the thermoelectric material layer 50 and the substrate 11 such that a current signal generated by detecting a resistance variation due to absorbed heat may be transmitted to the substrate 11 via the lead wire 60. According to the infrared detector 10, since the heat separation layer 70 is included and thus heat generated due to absorption of infrared light is transferred to the substrate 11 only via the lead wire 60, the heat transferred to the substrate 11 may be minimized. The lead wire 60 may be formed of a material including a thermoelectric material. For example, the lead wire 60 may be formed of a thermoelectric material the same as or different from the thermoelectric material for foaming the thermoelectric material layer 50.

The heat separation layer 70 is formed between the substrate 11 and the thermoelectric material layer 50 to prevent heat generated by the resonator 30 and the thermoelectric material layer 50 from being transferred to the substrate 11 or to reduce the amount of heat generated by the resonator 30 and the thermoelectric material layer 50 being transferred to the substrate 11, and may be formed of a vacuum layer or a low thermal conductive layer such as an air layer.

The heat separation layer 70 may be disposed between the ground plane layer 90 and the thermoelectric material layer 50, as illustrated in FIG. 2. Alternatively, the heat separation layer 70 may be disposed between the substrate 11 and the ground plane layer 90, as illustrated in FIG. 3.

In other words, the ground plane layer 90 may be disposed between the heat separation layer 70 and the substrate 11, as illustrated in FIG. 2, or between the thermoelectric material layer 50 and the heat separation layer 70, as illustrated in FIG. 3. The ground plane layer 90 may reflect incident infrared light toward the resonator 30, and may further increase infrared absorption efficiency by generating plasmon resonance together with the resonator 30. The ground plane layer 90 may have a thickness equal to or greater than a certain value, e.g., about 100 nm, such that incident infrared light is hardly transmitted to the substrate 11. As such, the substrate 11 under the ground plane layer 90 may hardly influence a resonance phenomenon.

When a current is generated by the resonator 30 due to the plasmon resonance, a mirror image of the current generated by the resonator 30 is generated to the ground plane layer 90, a strong magnetic field is formed due to an antiparallel current, and thus infrared absorption efficiency due to resonance may be further improved. As described above, the ground plane layer 90 may function as a component of the resonator 30 in the absorber and may generate some heat.

When the heat separation layer 70 is disposed between the ground plane layer 90 and the thermoelectric material layer 50, as illustrated in FIG. 2, the ground plane layer 90 may include a metal and may be formed on the substrate 11, and the resonator 30 may include a metal for generating a larger amount of heat due to absorption of incident light in an infrared wavelength region in comparison to the ground plane layer 90, and thus may minimize the amount of heat generated by the ground plane layer 90. For example, the resonator 30 may include Ti and the ground plane layer 90 may include at least one selected from the group consisting of Au, Ag, and Al. When the ground plane layer 90 is formed on the substrate 11, as illustrated in FIG. 2, heat generated by the ground plane layer 90 may not be used to detect a signal and may be lost.

Alternatively, the heat separation layer 70 may be disposed between the substrate 11 and the ground plane layer 90, as illustrated in FIG. 3. In this case, the ground plane layer 90 may include a metal and may contact the thermoelectric material layer 50. When the ground plane layer 90 contacts the thermoelectric material layer 50, since heat generated by the ground plane layer 90 may also be used to detect a signal, the resonator 30 may include a metal the same as the metal included in the ground plane layer 90, or a metal for generating a larger amount of heat in comparison to the ground plane layer 90.

The above-described infrared detector 10 forms a floating plasmon or metamaterial absorber for absorbing incident infrared light by combining the resonator 30, the thermoelectric material layer 50, the heat separation layer 70, and the ground plane layer 90, and generates plasmon or metamaterial resonance at a certain wavelength. When dielectric constants, sizes, thicknesses, etc. of the above four elements are optimized, complete light absorption may occur near the plasmon or metamaterial resonance wavelength.

In the infrared detector 10, since a plasmon resonance phenomenon is influenced by the heat separation layer 70, the thickness of the heat separation layer 70, the shape and thickness of the thermoelectric material layer 50, and the size and thickness of the resonator 30 may be adjusted to be optimized, and almost 100% of light absorption may be allowed at the plasmon or metamaterial resonance wavelength by using the newly optimized factors.

Figure 4:
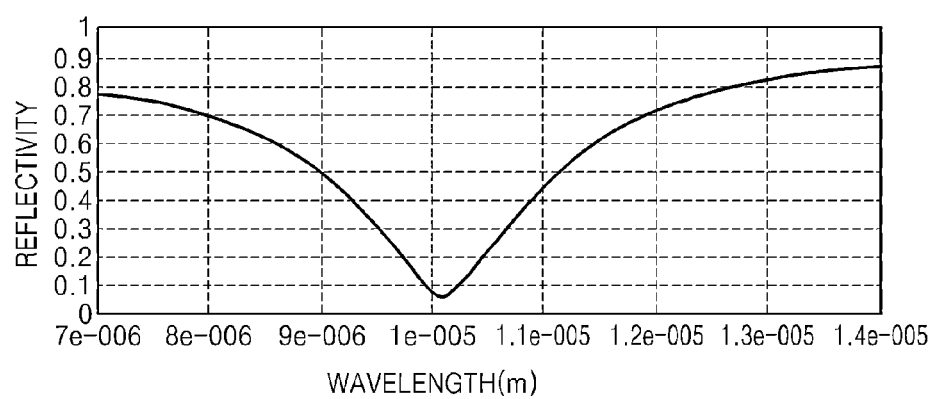
FIG. 4 is a graph showing an absorption wavelength spectrum of an absorber of an infrared detector according to some example embodiments.

FIG. 4 is a graph showing an absorption wavelength spectrum in an absorber of the infrared detector 10 illustrated in FIG. 1. In FIG. 4, a maximum absorption occurs at a wavelength having a minimum reflectivity.

In this case, the absorbed light energy is transformed into thermal energy by each layer. The thermal energy generated by each element is given by the following equation.

$$\int_V (1/2) \epsilon_0 \omega \mathrm{Im} \epsilon(\omega) |E|^2 dV$$

Figure 5:
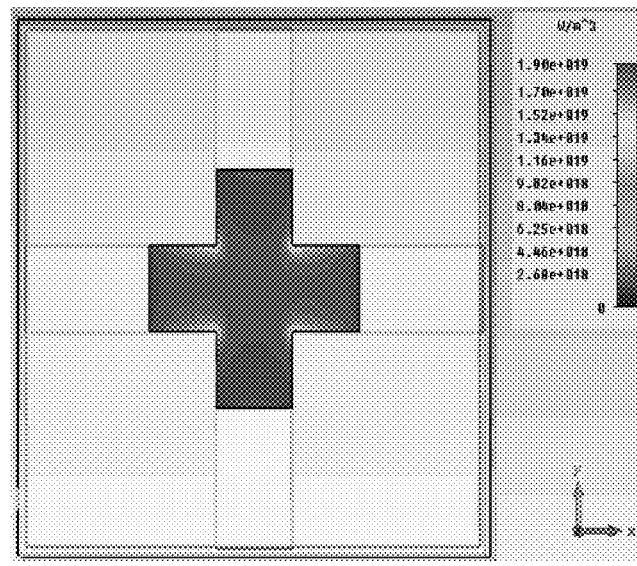
FIG. 5 is an image showing the distribution of energy absorbed by a resonator (heat distribution)
Figure 6:
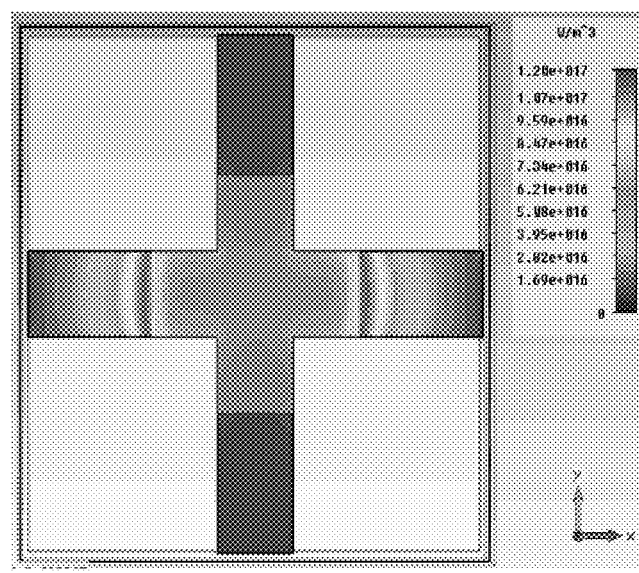
FIG. 6 is an image showing the distribution of energy absorbed by a thermoelectric material layer (heat generation distribution)
Figure 7:
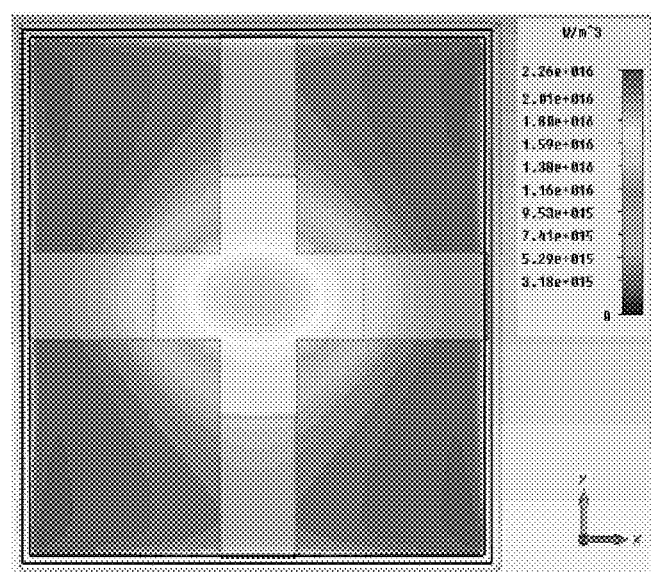
FIG. 7 is an image showing the distribution of energy absorbed by a ground plane layer.

For example, absorbed energy distributions of incident infrared light at a wavelength of 10 μm are shown in FIGS. 5 through 7. FIG. 5 is an image showing the energy distribution (heat distribution) absorbed by the resonator 30. FIG. 6 is an image showing the energy distribution (heat generation distribution) absorbed by the thermoelectric material layer 50. FIG. 7 is an image showing the distribution of energy absorbed by the ground plane layer 90. FIGS. 5 through 7 show an example when the resonator 30 has a cross shape and when the ground plane layer 90 is disposed on the substrate 11, as illustrated in FIG. 2.

As shown in FIGS. 5 through 7, when a metal having a large amount of loss, i.e., a metal for generating a large amount of heat, at a wavelength band of interest (for example, Ti) is used to form both of the resonator 30 and the ground plane layer 90, heat is mostly generated by the resonator 30, and is partially generated by the thermoelectric material layer 50 and the ground plane layer 90.

In the structure illustrated in FIG. 2, heat generated by the ground plane layer 90 is emitted externally via the substrate 11 and thus causes a signal loss. When different types of metal are used to form the resonator 30 and the ground plane layer 90, a signal loss in which heat generated by the ground plane layer 90 is emitted externally via the substrate 11 may be reduced. For example, heat generated by the ground plane layer 90, when a metal having a large amount of loss, i.e., a metal for generating a large amount of heat (for example, Ti) is used to form the resonator 30, and a metal having a small amount of loss, i.e., a metal for generating a small amount of heat, (for example, Au) is used to form the ground plane layer 90, may be minimized and, thus, the size of a signal may be increased.

Figure 8A:
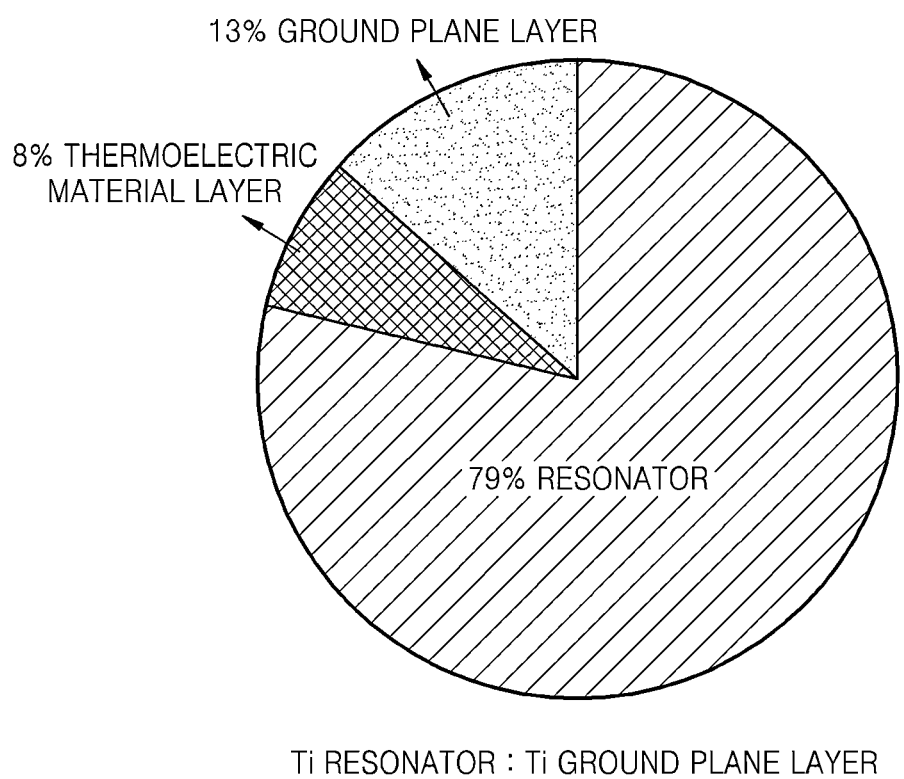
FIG. 8A is a pie chart showing a relative heat generation distribution when titanium (Ti) is used to form both of a resonator and a ground plane layer.
Figure 8B:
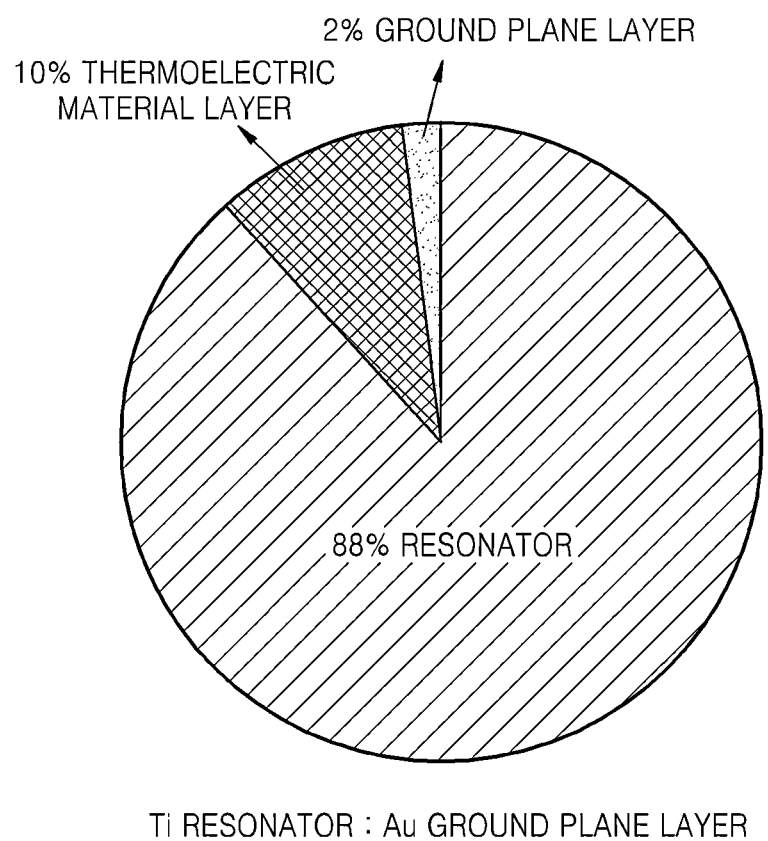
FIG. 8B is a pie chart showing a relative heat generation distribution when titanium (Ti) is used to form a resonator and gold (Au) is used to form a ground plane layer.

Relative heat generation distributions of the resonator 30, the thermoelectric material layer 50, and the ground plane layer 90 in the above two cases are shown in FIGS. 8A and 8B. FIG. 8A is a pie chart showing a relative heat generation distribution when Ti is used to form both of the resonator 30 and the ground plane layer 90. FIG. 8B is a pie chart showing a relative heat generation distribution when Ti is used to form the resonator 30 and Au is used to form the ground plane layer 90.

As shown in FIGS. 8A and 8B, in comparison to a case when Ti is used to form both of the resonator 30 and the ground plane layer 90, when Ti and Au are respectively used to form the resonator 30 and the ground plane layer 90, the loss of heat emitted externally from the ground plane layer 90 via the substrate 11 may be reduced by about 10%. In any of the above cases, heat is mostly generated by the resonator 30, is partially generated by the thermoelectric material layer 50, may be prevented by the heat separation layer 70 from being directly transferred to the substrate 11 (or such heat transfer may be reduced), and may be transferred only via the lead wire 60. Accordingly, an effect of increasing the temperature of the thermoelectric material layer 50 due to absorption of light may be maximized.

Otherwise, when the structure illustrated in FIG. 3 is used, since heat generated by the ground plane layer 90 is transferred only via the lead wire 60, a desired effect may be achieved even though the resonator 30 and the ground plane layer 90 are formed of the same metal (for example, Ti). In this structure, heat may be prevented from being directly transferred to the substrate 11 (or such heat transfer may be reduced) and thus an effect of more efficiently increasing a signal size may be expected.

Meanwhile, although the resonator 30 of the infrared detector 10 exemplarily has a ring shape in FIG. 1 or has a cross shape (a combined shape of bars) in FIGS. 5 through 7, the resonator 30 and the thermoelectric material layer 50 corresponding to the resonator 30 may have various geometric shapes as long as a plasmon absorber for absorbing infrared light by using LSPR, or a metamaterial absorber for absorbing infrared light by using resonance of a metamaterial is formed. For example, as a plasmon absorber for absorbing infrared light by using LSPR, the resonator 30 may have various lengths or widths within a range equal to or less than about a half of a wavelength λ of incident infrared light (λ/2).

The resonator 30 may have a disk shape, a ring shape, a bar shape, or a combined shape of bars, and the thermoelectric material layer 50 may have a shape the same as that of the resonator 30, and may have an area equal to or slightly greater than that of the resonator 30.

Figure 9:
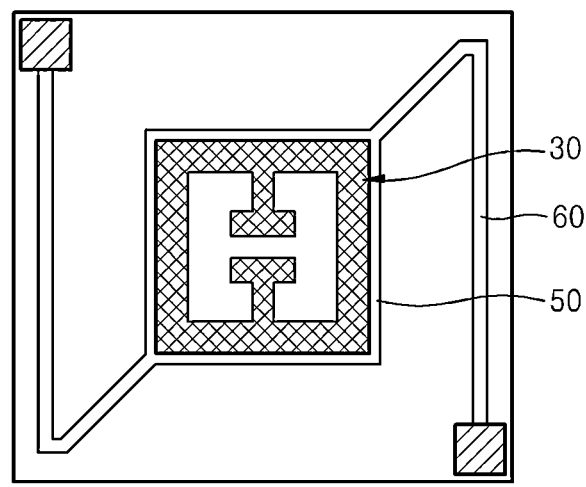
FIGS. 9 and 10 are top views showing various shapes of a resonator of an infrared detector according to some example embodiments.
Figure 10:
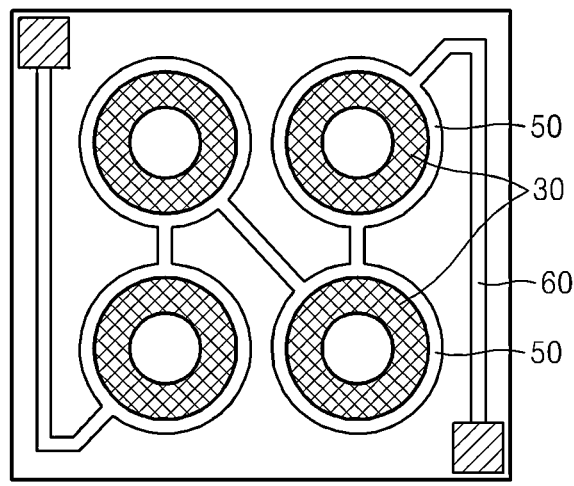

FIGS. 9 and 10 are top views showing various shapes of the resonator 30 of the infrared detector 10.

Referring to FIG. 9, the resonator 30 may have a shape in which portions of two facing sides of a rectangular ring extend inward and bars are formed at ends of the extending portions to face each other, and the thermoelectric material layer 50 may have a shape the same as that of the resonator 30, and may have an area slightly greater than that of the resonator 30.

Referring to FIG. 10, the resonator 30 may have a shape of a plurality of rings, and the thermoelectric material layer 50 may have a shape the same as that of the resonator 30 and in which the rings are connected in series, and may have an area slightly greater than that of the resonator 30.

The infrared detector 10 includes a two-dimensional (2D) array of structures each including the resonator 30 and the thermoelectric material layer 50 having various shapes as described above, and may be directly applied to, for example, one of an infrared detector, an infrared thermal camera, an infrared thermal sensor, a terahertz detector and a terahertz image sensor having an alignment of 2D pixels.

According to the infrared detector 10, since the resonator 30 may have a small cross-sectional area, a thermal mass of an absorber may be greatly reduced and a loss of generated heat due to transference may be effectively prevented. As such, since the temperature of a thermoelectric material may be increased due to absorption of infrared or terahertz light that reaches each pixel of a detector or an image sensor, a signal-to-noise ratio of the image sensor may be greatly improved and a pixel size of the image sensor may be reduced.

While example embodiments have been particularly shown and described, it will be understood by those of ordinary skill in the art that various changes in form and details may be made therein without departing from the spirit and scope of the present invention as defined by the following claims.

What is claimed is:

1. An infrared detector, comprising:
   a substrate;
   a resonator spaced apart from the substrate, the resonator absorbing incident infrared light;
   a thermoelectric material layer contacting the resonator and having a variable resistance according to temperature variation due to the absorbed incident infrared light;
   a lead wire electrically connecting the thermoelectric material layer and the substrate;
   a heat separation layer, formed of a low thermal conductive layer, between the substrate and the thermoelectric material layer, the heat separation layer preventing heat from being transferred from the thermoelectric material layer to the substrate;
   a ground plane layer preventing the incident infrared light from proceeding toward the substrate,
   wherein the ground plane layer is between the thermoelectric material layer and the heat separation layer, and
   wherein the ground plane layer directly contacts the thermoelectric material layer.

2. The infrared detector of claim 1, wherein the resonator includes metal for generating a larger amount of heat than the ground plane layer in an infrared wavelength region.

3. The infrared detector of claim 2, wherein the resonator includes one or more of titanium (Ti), nickel (Ni), chromium (Cr), copper (Cu), and platinum (Pt), and
   wherein the ground plane layer includes one or more of gold (Au), silver (Ag), and aluminum (Al).

4. The infrared detector of claim 1, wherein the ground plane layer includes metal, and
   wherein the ground plane layer contacts the thermoelectric material layer.

5. The infrared detector of claim 4, wherein the resonator includes metal generating a larger amount of heat than the ground plane layer or generating the same amount of heat as the ground plane layer in an infrared wavelength region.

6. The infrared detector of claim 1, wherein the resonator is a plasmon absorber, absorbing infrared light by using localized surface plasmon resonance (LSPR), or a metamaterial absorber, absorbing infrared light by using resonance of a metamaterial.

7. The infrared detector of claim 6, wherein the low thermal conductive layer is a vacuum layer.

8. The infrared detector of claim 6, wherein the thermoelectric material layer includes vanadium oxide (VOx), amorphous silicon (a-Si), or vanadium oxide (VOx) and amorphous silicon (a-Si).

9. The infrared detector of claim 6, wherein the thermoelectric material layer supports the resonator.

10. The infrared detector of claim 9, wherein the thermoelectric material layer has a same shape as the resonator, and
    wherein the thermoelectric material layer has an area greater than or equal to that of the resonator.

11. The infrared detector of claim 6, wherein the thermoelectric material layer absorbs the incident infrared light.

12. The infrared detector of claim 1, wherein the low thermal conductive layer is a vacuum layer.

13. The infrared detector of claim 1, wherein the thermoelectric material layer includes vanadium oxide (VOx), amorphous silicon (a-Si), or vanadium oxide (VOx) and amorphous silicon (a-Si).

14. The infrared detector of claim 1, wherein the thermoelectric material layer supports the resonator.

15. The infrared detector of claim 14, wherein the thermoelectric material layer has a same shape as the resonator, and
    wherein the thermoelectric material layer has an area greater than or equal to that of the resonator.

16. The infrared detector of claim 1, wherein the thermoelectric material layer absorbs the incident infrared light.

17. An infrared detector, comprising:
    a substrate;
    a heat separation layer, formed of a low thermal conductive layer, on the substrate;
    a ground plane layer on the heat separation layer;
    a thermoelectric material layer on the ground plane layer, wherein the thermoelectric material layer directly contacts the ground plane layer; and
    a resonator on the thermoelectric material layer;
    wherein the resonator is configured to absorb incident infrared light,
    wherein the thermoelectric material layer has a variable resistance according to temperature variation due to the absorbed incident infrared light,
    wherein the heat separation layer at least reduces heat transfer from the thermoelectric material layer to the substrate, and
    wherein the ground plane layer at least reduces an amount of the incident infrared light that reaches the substrate.

18. The infrared detector of claim 17, further comprising:
    a lead wire electrically connecting the thermoelectric material layer and the substrate.

* * * * *